(12) United States Patent
Seeber

(10) Patent No.: US 8,063,638 B2
(45) Date of Patent: Nov. 22, 2011

(54) LIQUID DIELECTRIC GRADIENT COIL SYSTEM AND METHOD

(75) Inventor: Derek Allan Seeber, Florence, SC (US)

(73) Assignee: General Electric Company, Schenectady, NY (US)

(*) Notice: Subject to any disclaimer, the term of this patent is extended or adjusted under 35 U.S.C. 154(b) by 20 days.

(21) Appl. No.: 12/415,999

(22) Filed: Mar. 31, 2009

(65) Prior Publication Data

US 2010/0244837 A1 Sep. 30, 2010

(51) Int. Cl.
*G01V 3/00* (2006.01)
(52) U.S. Cl. .................................. 324/318; 324/322
(58) Field of Classification Search .............. 324/318, 324/322
See application file for complete search history.

(56) References Cited

U.S. PATENT DOCUMENTS

| | | | |
|---|---|---|---|
| 5,012,191 A | 4/1991 | Siebold et al. | |
| 6,236,207 B1 | 5/2001 | Arz et al. | |
| 6,771,072 B2* | 8/2004 | Schuster et al. | 324/318 |
| 7,250,766 B2* | 7/2007 | Morita et al. | 324/318 |

FOREIGN PATENT DOCUMENTS

| | | |
|---|---|---|
| GB | 2259773 A | 3/1993 |
| JP | 1110353 A | 4/1989 |
| JP | 1208816 A | 8/1989 |
| JP | 3103233 A | 4/1991 |
| JP | 10234700 A | 9/1998 |

OTHER PUBLICATIONS

Borsi, et al. ; "Initiation and Formation of Partial Discharges in Mineral-based Insulating Oil." IEEE Transaction on Dielectrics and Electrical Insulation. vol. 1, Jun. 1994, p. 419.
Minhas et al.; "Enhancing the Flame, Thermal and Partial Discharge Performance of Mineral Oil." Proceeding from the 4th International Conference on Properties and Applications of Dielectric Materials. Brisbane, Australia. Jul. 3-8, 1994.
Hoch et al.; "The Effect of Increasing Concentration of Perchlorethylene on the Electrical Performance of Mineral Oil/ Perchlorethylene Mixtures." 7th International Symposium on High Voltage Engineering. Dresden, Germany. Aug. 26-30, 1991.
European Search Report and Written Opinion for corresponding EP10156999.4, Aug. 5, 2010.

* cited by examiner

*Primary Examiner* — Louis Arana
(74) *Attorney, Agent, or Firm* — Fletcher Yoder

(57) ABSTRACT

Magnetic resonance imaging systems having gradient coil assemblies employing a liquid dielectric medium are provided. In one embodiment, a magnetic resonance imaging system includes a gradient coil assembly with a plurality of gradient coils. In the gradient coil assembly, at least two of the gradient coils are electrically separated from one another by a fluid medium.

18 Claims, 6 Drawing Sheets

US 8,063,638 B2

LIQUID DIELECTRIC GRADIENT COIL SYSTEM AND METHOD

BACKGROUND

The subject matter disclosed herein relates generally to magnetic resonance imaging systems and, more particularly, to cooling and electrically separating two or more gradient coils for magnetic resonance imaging systems.

Magnetic resonance imaging (MRI) systems enable imaging based on a primary magnetic field, a radio frequency (RF) pulse, and time-varying magnetic gradient fields that interact with specific nuclear components in an object, such as hydrogen nuclei in water molecules. The magnetic moments of such nuclear components may attempt to align with the primary magnetic field, but subsequently precess at a characteristic frequency known as the Larmor frequency. An RF pulse at or near the Larmor frequency of such nuclear components may cause the magnetic moments to be rotated. When the RF pulse has ended, the magnetic moments may attempt to realign with the primary magnetic field, emitting a detectable signal.

At least three discrete gradient coils (x, y, and z) may produce time-varying magnetic gradient fields ($G_x$, $G_y$, and $G_z$) calculated to enable detection of signals from a specified slice of the object. Because the gradient coils may be disposed near to one another, a partial discharge of voltage may occasionally occur between two of the gradient coils, which may cause any images then being acquired to display one or more artifacts. To prevent partial discharge, each generally cylindrical gradient coil may be electrically separated from the other by a glass-filled, epoxy-based resin. Such an epoxy-based material may have many drawbacks, including low partial discharge inception voltage (PDIV) characteristics, inefficient gradient coil cooling, and long manufacturing cycles due to the vacuum pressure impregnation procedure generally employed in the manufacture of epoxy-based gradient coils.

BRIEF DESCRIPTION

Embodiments of the presently disclosed subject matter may generally relate to magnetic resonance imaging systems having gradient coil assemblies that employ a liquid dielectric medium. In one embodiment, a magnetic resonance imaging system includes a gradient coil assembly with a plurality of gradient coils. In the gradient coil assembly, at least two of the gradient coils are electrically separated from one another by a fluid medium.

In another embodiment, a magnetic resonance imaging system includes a gradient coil assembly having a first gradient coil and a second gradient coil. The first gradient coil and the second gradient coil are cooled by a liquid medium external to the first gradient coil and the second gradient coil.

In a further embodiment, a magnetic resonance imaging system includes a gradient coil assembly having at least two solid gradient coils. The at least two solid gradient coils are cooled by a liquid dielectric medium.

BRIEF DESCRIPTION OF THE DRAWINGS

These and other features, aspects, and advantages will become better understood when the following detailed description is read with reference to the accompanying drawings in which like characters represent like parts throughout the drawings, wherein.

DETAILED DESCRIPTION

Figure 1:
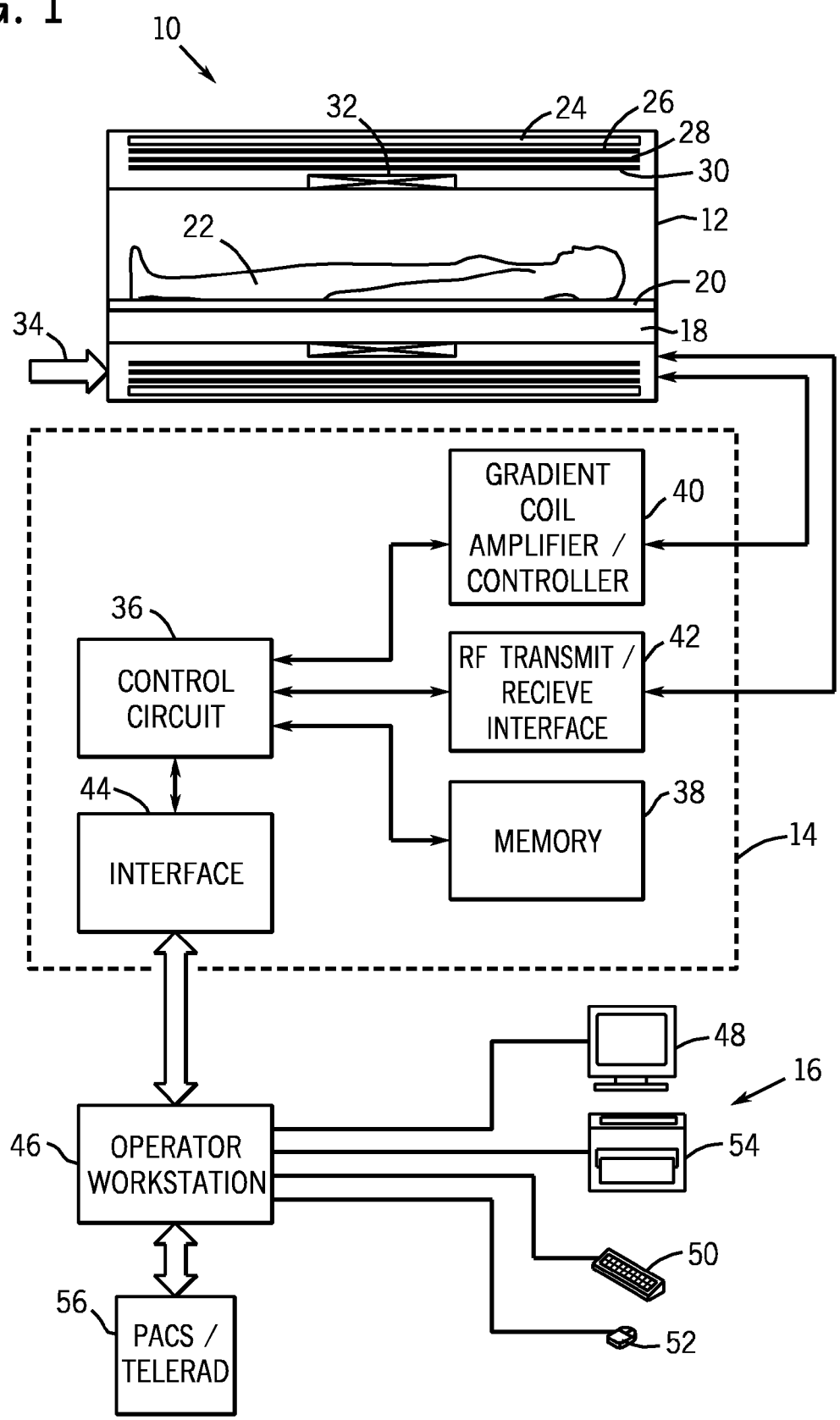
FIG. 1 is a diagrammatical representation of an MRI system that employs a fluid medium in a gradient coil assembly, in accordance with aspects of the present invention.

Turning now to the drawings, and referring first to FIG. 1, a magnetic resonance imaging (MRI) system 10 is illustrated diagrammatically as including a scanner 12, scanner control circuitry 14, and system control circuitry 16. While the MRI system 10 may include any suitable MRI scanner or detector, in the illustrated embodiment the system includes a full body scanner comprising an imaging volume 18 into which a table 20 may be positioned to place a patient 22 in a desired position for scanning. The scanner 12 may additionally or alternatively be configured to target certain anatomy, such as the head or neck.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field generally aligned with the imaging volume 18. A series of gradient coils 26, 28 and 30 are grouped in one or more gradient coil assemblies for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference numeral 34. In the embodiment illustrated in FIG. 1, the RF coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In a present configuration, the gradient coils 26, 28, and 30 may be formed of conductive wires, bars or plates which are wound or cut to form a coil structure which generates a gradient field upon application of control pulses. The placement of the coils within the gradient coil assembly may be done in several different orders and with varying configurations, and the scanner 12 may further include complementary gradient coils (in the manner described below) to shield the gradient coils 26, 28, and 30. Generally, a z-gradient coil 26 may be positioned at an outermost location, and is formed generally as a solenoid-like structure which has relatively little impact on the RF magnetic field. The gradient coils 28 and 30 may be x-axis and y-axis coils respectively.

The gradient coils 26, 28, and 30 of the scanner 12 may be controlled by external circuitry to generate desired fields and pulses, and to read signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF pulse at or near the Larmor frequency of the material of interest, resulting in rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28, and 30 may serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogenous in the other two. The three gradient coils 26, 28, and 30 have mutually orthogonal axes for the direction of their variation, enabling a linear field gradient to be imposed in an arbitrary direction with an appropriate combination of the three gradient coils 26, 28, and 30.

The pulsed gradient fields may perform various functions integral to the imaging process. Some of these functions are slice selection, frequency encoding and phase encoding. These functions can be applied along the x-, y- and z-axes of the original coordinate system or along other axes determined by combinations of pulsed currents applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radiofrequency pulses. In the diagrammatical view of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Further, the control circuit 36 may include memory circuitry 38, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The operator workstation 46 also typically includes memory circuitry for storing examination pulse sequence descriptions, examination protocols, user and patient data, image data, both raw and processed, and so forth. The operator workstation 46 may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference numeral 56 in FIG. 1. Such devices may include picture archiving and communication systems, teleradiology systems, and the like.

Figure 2:
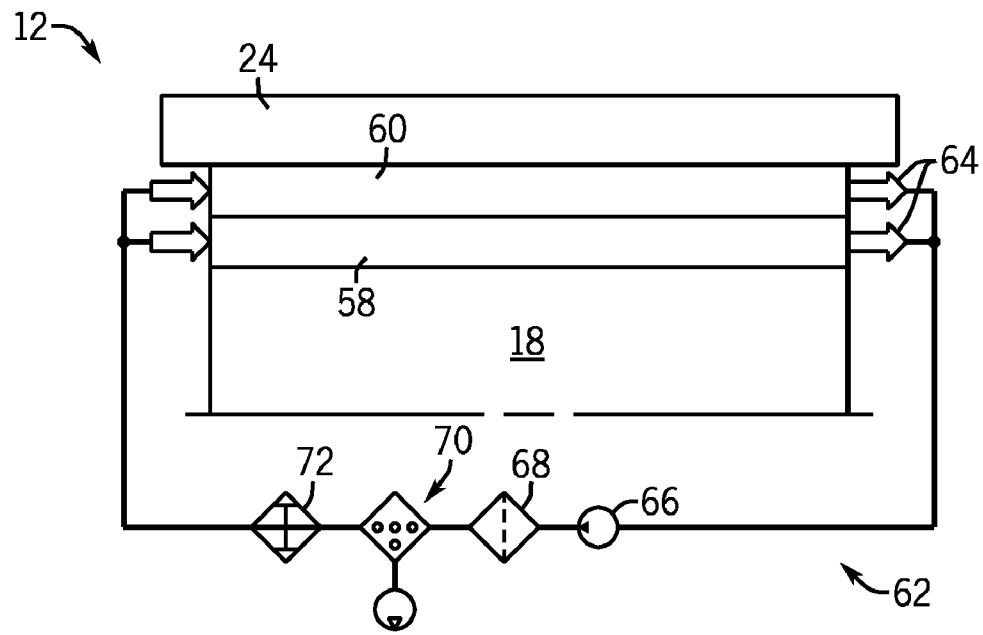
FIG. 2 is a cross-sectional schematic of an embodiment of a scanner of the MRI system of FIG. 1, in accordance with aspects of the present invention.

FIG. 2 illustrates a simplified schematic cross-sectional view of the top half of an embodiment of the scanner 12. It should be appreciated that the simplified view of FIG. 2 does not necessarily illustrate all elements of the scanner 12. As shown in FIG. 2, an inner gradient coil assembly 58, an outer gradient coil assembly 60, and the main magnet 24 may be disposed cylindrically around the imaging volume 18. The inner gradient coil assembly 58 and the outer gradient coil assembly 60 may each include a z-gradient coil 26, x-gradient coil 28, and y-gradient coil 30. As discussed further below, each of the gradient coils 26, 28, and 30 found within the inner gradient coil assembly 58 and the outer gradient coil assembly 60 may be electrically separated by a liquid dielectric medium that fills the spaces within inner gradient coil assembly 58 and/or the outer gradient coil assembly 60. In addition to dielectric functionality, the liquid dielectric medium may further serve as a coolant to the x, y, and z-gradient coils 26, 28, and 30 of the inner and outer gradient coil assemblies 58 and 60. Accordingly, rather than be formed of hollow conductive material, the x, y, and z-gradient coils 26, 28, and 30 of the inner and outer gradient coil assemblies 58 and 60 may be formed of solid conductive material. As discussed below with reference to FIGS. 9-11, the liquid dielectric medium may include several components, including mineral oil and/or an electronegative liquid such as perchlorethylene ($C_2Cl_4$).

A fluid circulation system 62 may circulate the liquid dielectric medium throughout the inner and/or outer gradient coil assemblies 58 or 60. To enter the fluid circulation system 62, the liquid dielectric medium may exit the inner gradient coil assembly 58 and the outer gradient coil assembly 60 via one or more outlets 64. A pump 66 may pump the liquid dielectric medium through a filter 68, which may remove impurities that may build up in the liquid dielectric medium. The pump 66 may also maintain the liquid dielectric medium at a pressure of one atmosphere or greater within the inner gradient coil assembly 58 and/or the outer gradient coil assembly 60. Thereafter, a degassing system 70, which may include a degassing component and a vacuum pump component, may remove gas bubbles that may form in the liquid dielectric medium in the inner and outer gradient coil assemblies 58 and 60. A cooler 72 may remove heat from the liquid dielectric medium before the liquid dielectric medium is recirculated into the inner and/or outer gradient coil assemblies 58 or 60. It should be noted that the filter 68 and the degassing system 70 may remove impurities in the liquid dielectric medium that may commonly arise in areas of high electrical stresses. Because the impurities could result in partial discharge events, continuously circulating the liquid dielectric medium using the fluid circulation system 62 may reduce the risk of discharge, while simultaneously removing heat from the inner gradient coil assembly 58 and the outer gradient coil assembly 60.

Figure 3:
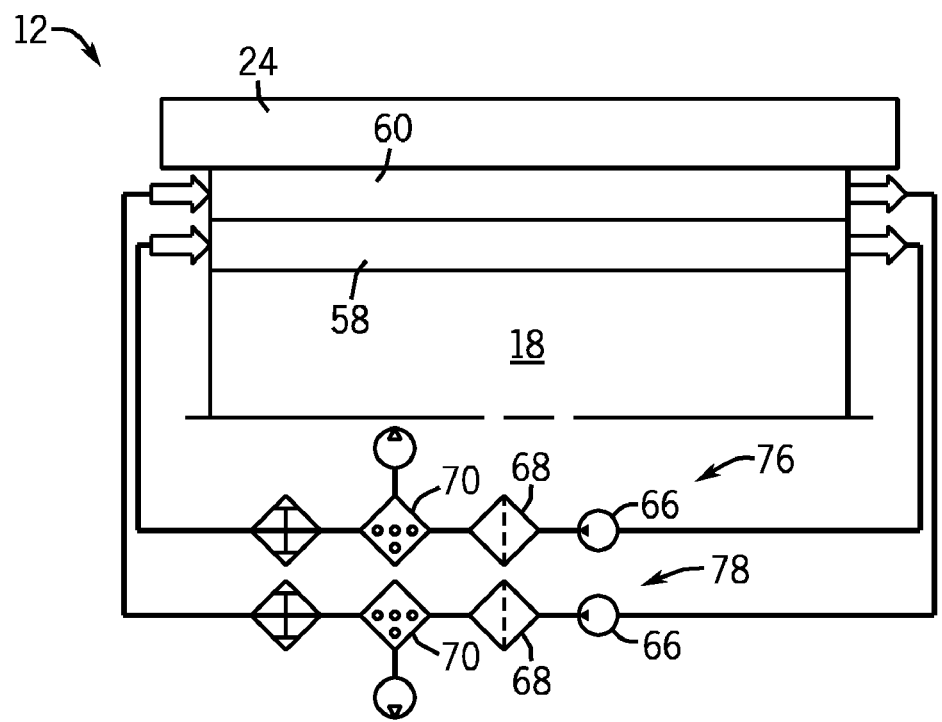
FIG. 3 is a cross-sectional schematic of an alternative embodiment of the scanner of the MRI system of FIG. 1, in accordance with aspects of the present invention.

FIG. 3 illustrates a simplified schematic cross-sectional view of the top half of an alternative embodiment of the scanner 12. It should be appreciated that the simplified view of FIG. 3 does not necessarily illustrate all elements of the scanner 12. As in FIG. 2 above, the scanner 12 of FIG. 3 includes the inner gradient coil assembly 58, the outer gradient coil assembly 60, and the main magnet 24, disposed cylindrically around the imaging volume 18. The inner gradient coil assembly 58 and the outer gradient coil assembly 60 may each include a z-gradient coil 26, x-gradient coil 28, and y-gradient coil 30. Rather than be formed of hollow conductive material, the x, y, and z-gradient coils 26, 28, and 30 of the inner and outer gradient coil assemblies 58 and 60 may be formed of solid conductive material. As discussed further below, each of the gradient coils 26, 28, and 30 found within the inner gradient coil assembly 58 and the outer gradient coil assembly 60 may be electrically separated by a liquid dielectric medium that fills the spaces within the inner gradient coil assembly 58 and/or the outer gradient coil assembly 60. In contrast to the embodiment of FIG. 2, an inner gradient coil circulation system 76 may circulate and cool the liquid dielectric medium throughout the inner gradient coil assembly 58, while an outer gradient coil circulation system 78 may circulate and cool the liquid dielectric medium in the outer gradient coil assembly 60. The inner and outer gradient coil circulation systems 76 and 78 may each include pumps 66, filters 68, degassing systems 70, and coolers 72.

Figure 4:
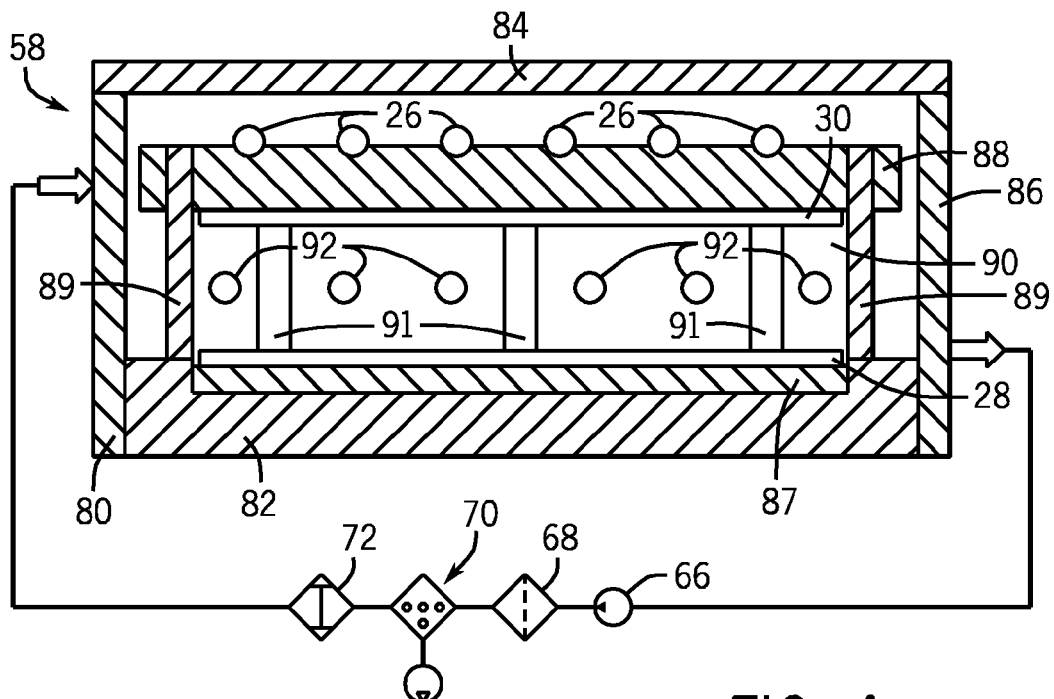
FIG. 4 is a cross-sectional schematic of a gradient coil assembly for the scanner of FIG. 1, in accordance with aspects of the present invention.

FIG. 4 illustrates a more detailed schematic cross-sectional view of the top half of the inner gradient coil assembly 58 of an embodiment of the scanner 12. It should be appreciated that while FIG. 4 illustrates the inner gradient coil assembly 58, the inner gradient coil assembly 58 is intended to be exemplary of either the inner or outer gradient coil assemblies 58 or 60. Because the use of a liquid dielectric medium in the inner gradient coil assembly 58 and the outer gradient coil assembly 60 may introduce challenges relating to mechanical rigidity, which in turn may limit the effect of electromagnetic forces on the gradient coils 26, 28, and 30, the embodiment of FIG. 4 accounts for such forces. The structure of the inner gradient coil assembly 58 may include, for example, a rear flange 80, behind which an inner drum 82 may be formed. The inner drum 82 may be formed from an FR4 cylinder. The inner drum 82 may fit within an outer drum 84, which may also be formed from an FR4 cylinder. As described with reference to FIG. 5 below, the inner drum 82 may attach to the rear flange 80 and the outer drum 84 may attach to a front flange 86.

An x-gradient board 87 formed from an FR4 cylinder holding the x-gradient coil 28 may be attached with glue and/or screws to a portion of the inner drum 82. The inner drum 82 may be recessed to assist with mechanical attachment of the x-gradient board 87 to the inner drum 82 and to provide rigidity in response to electromagnetic forces. A y-gradient board 88 formed from an FR4 cylinder holding the y-gradient coil 30 may be attached to standoffs 89 with glue and/or screws. The standoffs 89 may attach the y-gradient board 88 to the inner drum 82 through gaps in the x-gradient board 87 and through eyes of the x-gradient coil 28. The gradient coils 28 and 30 may be placed copper-side down, such that approximately 2-3 mm may separate them. The z-gradient coil 26 may attach to the outer diameter of the y-gradient board 88 via grooves that may be machined in the y-gradient board 88, which may have a thickness of approximately 5-10 mm.

An inner volume 90, bounded by the rear flange 80, the inner drum 82, the outer drum 84, and the front flange 86, may be filled with the liquid dielectric medium. The inner volume 90 may be maintained using a series of spacers 91 disposed throughout the inner volume 90. The spacers 91 may include, for example, spacing straps to minimize movement caused by electromagnetic forces on the z-gradient coil 26, x-gradient coil 28, and y-gradient coil 30. Each spacer 91 may include a non-metallic strap that may be wrapped around the x-gradient coil 28 and y-gradient coil 30, with tension, in a spiral, to provide additional gap separation and more mechanical rigidity. The non-metallic straps of the spacers 91 may be made of plastic or cotton, for example, which may be completely saturated by the liquid dielectric medium. Cooling fluid conduits 92 may distribute the liquid dielectric medium throughout the inner volume 90, as described further below.

Figure 5:
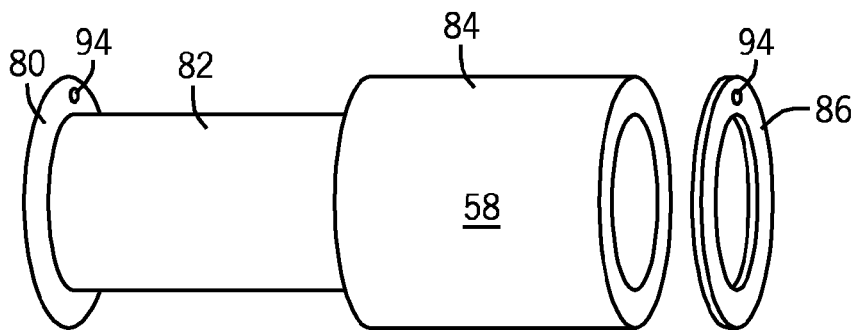
FIG. 5 is a perspective view of the gradient coil assembly of FIG. 4.

FIG. 5 provides a partially exploded view of the inner and outer drums 82 and 84 of the inner gradient coil assembly 58 depicted in FIG. 4. As shown in FIG. 5, the rear flange 80 may be joined to the inner drum 82. The inner drum 82 may fit within the outer drum 84 and the outer drum 84 may attach to the front flange 86. The rear flange 80 may thereafter attach to both the inner drum 82 and the outer drum 84. The rear flange 80 and the front flange 86 may have a fluid connection 94, through which the liquid dielectric medium may enter and exit the inner gradient coil assembly 58. It should be understood that the inner and outer drums 82 and 84 may be made to fit together in the manner illustrated in FIG. 4.

Figure 6:
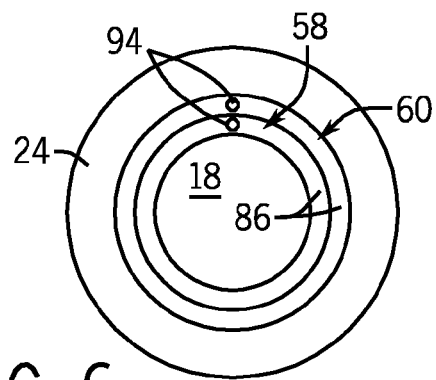
FIG. 6 is a transverse view of the gradient coil assembly of FIG. 4.

FIG. 6 represents a simplified transverse view of an end of an embodiment of the scanner 12 having inner and outer gradient coil assemblies 58 and 60. It should be appreciated that the simplified view of FIG. 6 does not necessarily illustrate all elements of the scanner 12. The main magnet 24 may surround the cylindrical outer gradient coil assembly 60 and inner gradient coil assembly 58. The front flange 86 of both of the inner gradient coil assembly 58 and the outer gradient coil assembly 60 may include fluid connections 94, through which the liquid dielectric medium may enter and exit the gradient coil assemblies 58 and 60.

Figure 7:
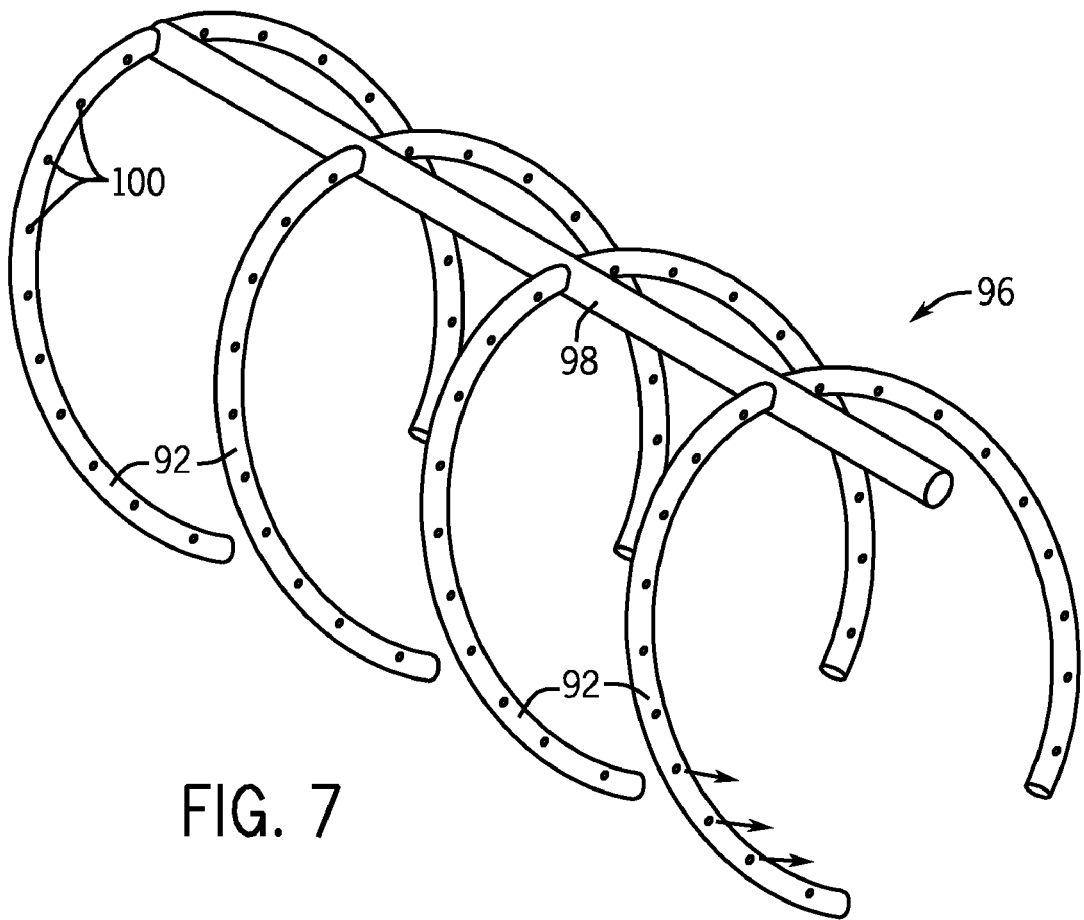
FIG. 7 is a perspective view of a manifold that may circulate the fluid medium within the gradient coil assembly of FIG. 4, in accordance with aspects of the present invention.

FIG. 7 illustrates a manifold 96 that may disperse the liquid dielectric medium throughout the inner or outer gradient coil assemblies 58 and/or 60. As illustrated in FIG. 7, the liquid dielectric medium may enter through an inlet manifold 98 that may be coupled to the fluid connection 94 of FIG. 5 or 6. Conduits 92 may be distributed along the inlet manifold 98. The liquid dielectric medium may travel from the inlet manifold 98 to the conduits 92, subsequently exiting the manifold 96 through a plurality of apertures 100 in the conduits 92. The liquid dielectric medium may exit through a complementary outlet manifold, which may have complementary conduits with outlet apertures to draw the liquid dielectric medium away through the outlet of the fluid connection 94. Alternatively, the liquid dielectric medium may exit through a single outlet at the fluid connection 94.

Figure 8:
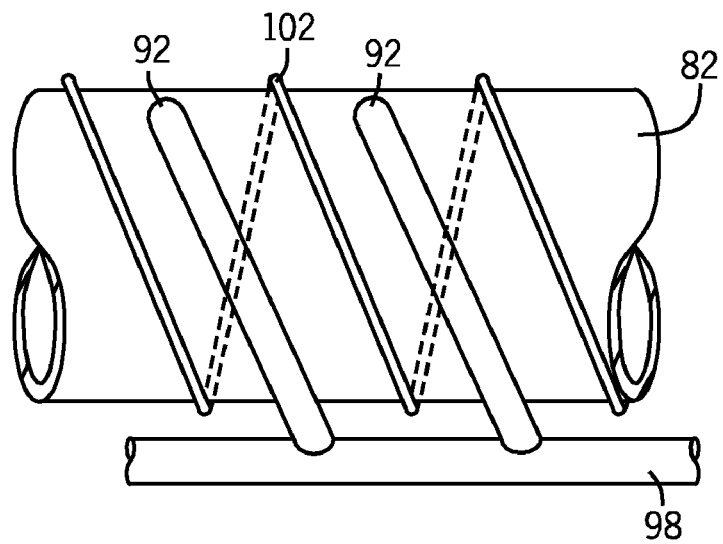
FIG. 8 is side view of the manifold of FIG. 7.

FIG. 8 illustrates a configuration of the manifold 96 in which the manifold 96 may interact with other elements of the scanner 12. As illustrated in FIG. 8, the inlet manifold 98 of the manifold 96 may include the conduits 92, which may wrap around the inner drum 82 of the inner gradient coil assembly 58. As such, the conduits 92 may be angled to fit between non-metallic straps 102, which may be one representation of the spacers 91 of FIG. 4.

Figure 9:
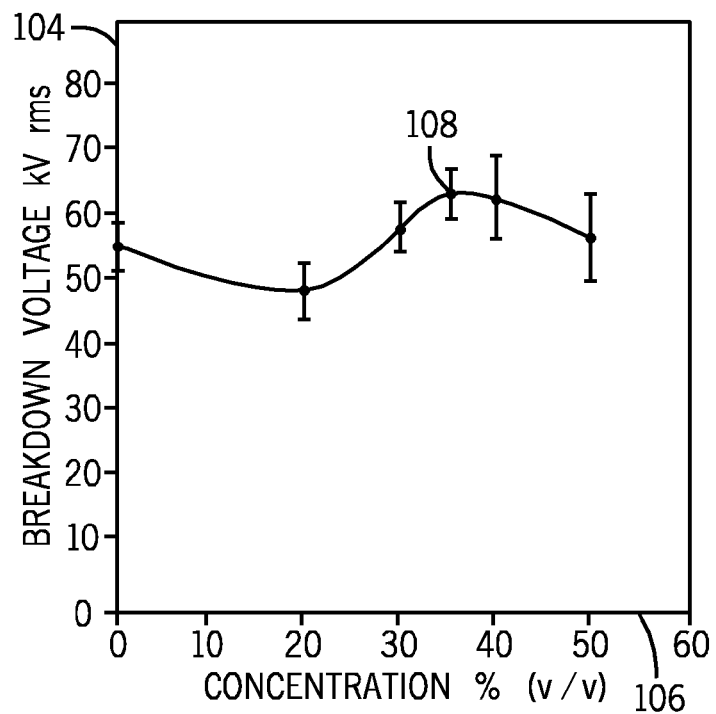
FIG. 9 is a graph illustrating a relationship between breakdown voltage and a concentration of perchlorethylene ($C_2Cl_4$) in mineral oil for a sphere-sphere geometry.
Figure 10:
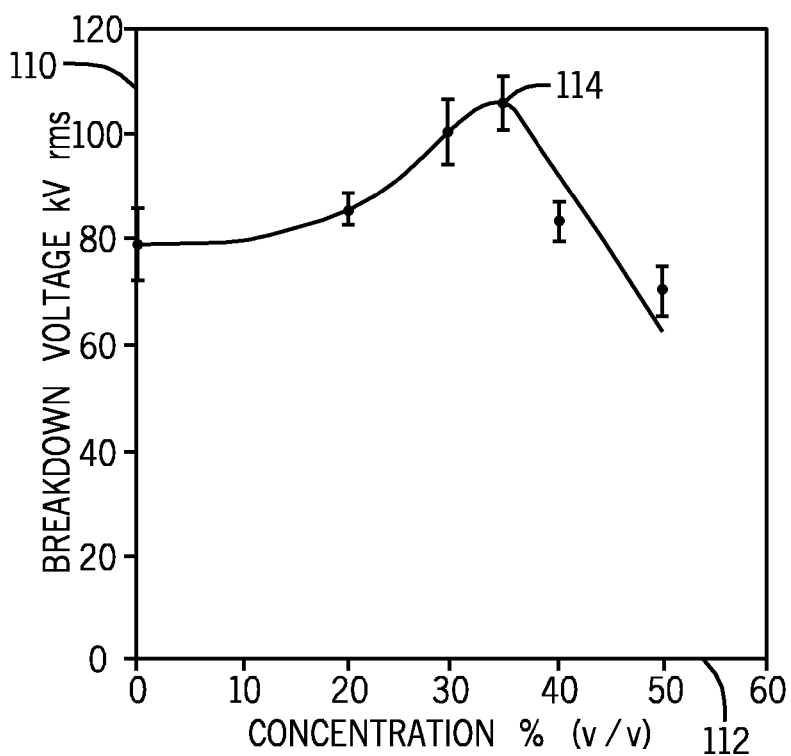
FIG. 10 is a graph illustrating a relationship between breakdown voltage and a concentration of perchlorethylene ($C_2Cl_4$) in mineral oil for a point-sphere geometry.
Figure 11:
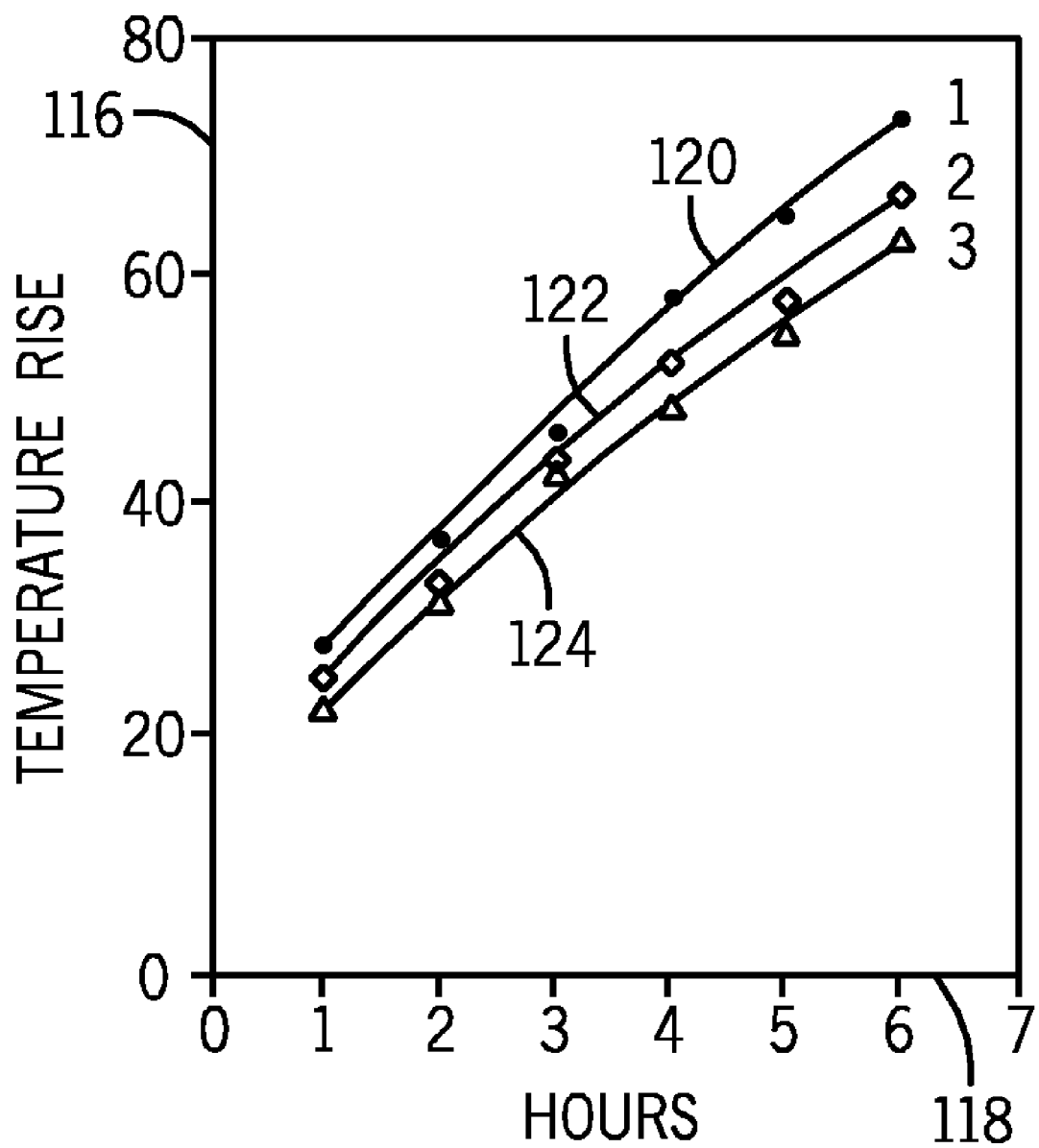
FIG. 11 is a graph illustrating a relationship between a temperature rise in gradient coil windings and a concentration of perchlorethylene ($C_2Cl_4$) in mineral oil.

FIGS. 9-11 depict results that may be achieved for various compositions of liquid dielectric medium. The liquid dielectric medium used to electrically separate the various components of the inner gradient coil set and the outer gradient coil set may include a variety of liquid media. For example, the liquid dielectric medium may include transformer oil or mineral oil, or may include a mixture of mineral oil and another liquid. Because a partial discharge event may cause white pixels to appear in an image obtained by the scanner 12, the liquid dielectric medium may serve to reduce the number of white pixels caused by such partial discharge events. Moreover, rather than discharge in less than one microsecond, as may be typical for epoxy-based dielectric media, the liquid dielectric medium may typically discharge in less than 10 microseconds. Having a relatively longer discharge time may advantageously contain less of a frequency component at MRI operating frequencies, which may limit the adverse effects of those partial discharge events that may occur.

The liquid dielectric medium may be enhanced by the inclusion of an electronegative liquid. The electronegative liquid may be, for example, perchlorethylene ($C_2Cl_4$), which may further inhibit partial discharge formation. FIGS. 9 and 10 both illustrate a relationship between breakdown voltage and a concentration of an additional electronegative liquid in mineral oil, perchlorethylene ($C_2Cl_4$), at various geometries. Turning first to FIG. 9, an ordinate 104 represents mean breakdown voltage in units of $kV_{rms}$ with a sphere-sphere geometry (2.5 mm gap, 20° C.), and an abscissa 106 represents a concentration of perchlorethylene in the liquid dielectric medium. As shown in FIG. 9, breakdown voltage reaches a local maximum 108 when the concentration of perchlorethylene is approximately 35%. Turning next to FIG. 10, an ordinate 110 represents mean breakdown voltage in units of $kV_{rms}$ with a point-sphere geometry (25 mm gap, 20° C.), and an abscissa 112 represents the concentration of perchlorethylene as a percentage of the liquid dielectric medium. As in FIG. 9, in FIG. 10, breakdown voltage reaches a local maximum 114 at a concentration of approximately between 20% and 50%, between 30% and 40%, or approximately 35%.

As noted above, a mixture of perchlorethylene and mineral oil may increase a breakdown voltage at certain concentrations. The perchlorethylene-mineral oil mixture may additionally have other benefits beyond increasing the partial discharge inception voltage (PDIV). For example, a liquid dielectric medium of mineral oil having approximately 35% perchlorethylene may have a lower viscosity (e.g., 4 centipoises, as compared to 30 centipoises for 100% mineral oil). Such a lower viscosity may assist to completely coat the surface of the gradient coil components. Moreover, the perchlorethylene-mineral oil mixture may have a thermal heat capacity beyond that of 100% mineral oil. As illustrated in FIG. 11, an ordinate 116 illustrates a general rise in temperature in gradient coil windings, while an abscissa 118 illustrates a duration of time in units of hours. A curve 130 represents a temperature rise over time for a 100% mineral oil, a curve 122 represents a temperature rise over time for a 35% perchlorethylene-mineral oil mixture, and a curve 124 represents a temperature rise over time for a 50% perchlorethylene-mineral oil mixture. While the 50% mixture produces the lowest temperature rise, the 35% perchlorethylene-mineral oil mixture produces a lower temperature rise than pure mineral oil.

Technical effects of the invention include, among other things, higher partial discharge inception voltage (PDIV) characteristics for the electrical separation of gradient coils for a magnetic resonance imaging (MRI) system and more efficient gradient coil cooling. Additionally, manufacturing cycles may be shortened as epoxy impregnation procedures may generally be avoided.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging system comprising:
a gradient coil assembly comprising:
a plurality of gradient coils, at least two of the gradient coils being electrically separated from one another by a fluid medium; and
a fluid circulating system for drawing the fluid medium from a volume between the two gradient coils and for circulating the fluid medium through the volume.

2. The system of claim 1, wherein the fluid medium is a dielectric liquid.

3. The system of claim 1, wherein the fluid circulating system includes a filter for removing contaminants from the fluid medium.

4. The system of claim 1, wherein the fluid circulating system includes a degassing component for removing gas from the fluid medium.

5. The system of claim 1, wherein the fluid circulating system includes a cooler for cooling the fluid medium.

6. The system of claim 1, comprising a manifold for drawing the fluid medium from the volume or for circulating the fluid medium through the volume.

7. The system of claim 1, wherein the at least two gradient coils are x- and y-gradient coils.

8. The system of claim 1, wherein the at least two gradient coils are x- and z-gradient coils.

9. The system of claim 1, wherein the at least two gradient coils are z- and y-gradient coils.

10. The system of claim 1, wherein a first of the two coils is disposed on an outer surface of an inner annular member and a second of the two coils is disposed on an inner surface of an outer annular member.

11. The system of claim 10, comprising a spacer between the inner and outer annular members.

12. The system of claim 10, wherein the ends of a volume bound by the inner and outer annular members are sealed by flanges.

13. A magnetic resonance imaging system comprising:
a gradient coil assembly comprising:
a first gradient coil; and
a second gradient coil;
wherein the first gradient coil and the second gradient coil are cooled by a liquid medium external to the first gradient coil and the second gradient coil, wherein the liquid medium comprises perchlorethylene.

14. The system of claim 13, wherein the first gradient coil and the second gradient coil are electrically separated from one another by the liquid medium.

15. The system of claim 13, comprising a fluid circulating system configured to circulate the liquid medium through the gradient coil assembly via a plurality of tubes.

16. The system of claim 15, wherein the fluid circulating system comprises one or more components configured to degas, purify, or cool the liquid medium.

17. The system of claim 15, wherein the fluid circulating system comprises a component configured to maintain the liquid medium at a pressure above one atmosphere in the gradient coil assembly.

18. A magnetic resonance imaging system comprising:
a gradient coil assembly having at least two solid gradient coils, wherein the at least two solid gradient coils are electrically separated from one another and cooled by a liquid dielectric medium; and
a fluid circulating system for drawing the liquid dielectric medium from the gradient coil assembly and for circulating the liquid dielectric medium through the gradient coil assembly.

* * * * *